US010886457B2

United States Patent
Lee et al.

(10) Patent No.: US 10,886,457 B2
(45) Date of Patent: Jan. 5, 2021

(54) SPIN ORBIT TORQUE MAGNETIC RAM

(71) Applicant: KOREA INSTITUTE OF SCIENCE AND TECHNOLOGY, Seoul (KR)

(72) Inventors: Oukjae Lee, Seoul (KR); Byoung-Chul Min, Seoul (KR)

(73) Assignee: KOREA INSTITUTE OF SCIENCE AND TECHNOLOGY

( * ) Notice: Subject to any disclaimer, the term of this patent is extended or adjusted under 35 U.S.C. 154(b) by 0 days.

(21) Appl. No.: 16/196,659

(22) Filed: Nov. 20, 2018

(65) Prior Publication Data

US 2019/0165254 A1 May 30, 2019

(30) Foreign Application Priority Data

Nov. 30, 2017 (KR) .......................... 10-2017-0162573

(51) Int. Cl.

| G11C 11/16 | (2006.01) |
|---|---|
| H01L 43/02 | (2006.01) |
| H01L 43/10 | (2006.01) |
| H01L 27/22 | (2006.01) |
| G11C 11/18 | (2006.01) |

(52) U.S. Cl.
CPC ............ *H01L 43/02* (2013.01); *G11C 11/161* (2013.01); *G11C 11/1655* (2013.01); *G11C 11/1657* (2013.01); *G11C 11/1659* (2013.01); *G11C 11/18* (2013.01); *H01L 27/228* (2013.01); *H01L 43/10* (2013.01); *G11C 11/1673* (2013.01); *G11C 11/1675* (2013.01)

(58) Field of Classification Search
CPC .............. G11C 11/161; G11C 11/1673; G11C 11/1659
USPC ......................................... 365/158, 171, 173
See application file for complete search history.

(56) References Cited

U.S. PATENT DOCUMENTS

| 2003/0189800 | A1* | 10/2003 | Pinarbasi | B82Y 25/00 |
| | | | | 360/324.12 |
| 2007/0086121 | A1* | 4/2007 | Nagase | B82Y 25/00 |
| | | | | 360/324.1 |
| 2009/0059656 | A1* | 3/2009 | Kanakasabapathy | |
| | | | | H01L 27/222 |
| | | | | 365/158 |
| 2018/0040667 | A1* | 2/2018 | Kim | H01L 43/08 |
| 2018/0366172 | A1* | 12/2018 | Wang | H01L 43/08 |
| 2019/0140166 | A1* | 5/2019 | Rahman | H01L 43/08 |

\* cited by examiner

*Primary Examiner* — Han Yang
(74) *Attorney, Agent, or Firm* — Mendelsohn Dunleavy, P.C.

(57) ABSTRACT

A spin torque magnetic RAM according to the present invention includes at least one row selection line positioned on a silicon substrate to induce a spin orbit interaction therein; at least one first magnetic pattern positioned on the row selection line; a second magnetic pattern positioned on the first magnetic pattern; a tunnel barrier positioned on the second magnetic pattern; and a third magnetic pattern positioned on the tunnel barrier, wherein the first magnetic pattern is made of a cobalt film, the first magnetic pattern and the second magnetic pattern have a total thickness of 5 nm to form a free layer, and the third magnetic pattern is formed with a pinned layer in which a magnetization direction is fixed.

12 Claims, 11 Drawing Sheets

SPIN ORBIT TORQUE MAGNETIC RAM

CROSS REFERENCE TO RELATED APPLICATION

The present application claims priority to Korean Patent Application No. 10-2017-0162573, filed on Nov. 30, 2017, the entire contents of which is incorporated herein for all purposes by this reference.

BACKGROUND OF THE INVENTION

Field of the Invention

The present invention relates to a spin orbit torque magnetic random access memory (RAM) in which a free layer of a magnetic tunnel junction (MTJ) is double-stacked at a memory cell driven by a spin orbit torque to cause a physical parameter to be controlled according to an accumulating order thereof, thereby controlling an electric current density consumed in the free layer.

Description of the Related Art

Recently, a magnetic RAM has been manufactured in such a manner that the magnetization of the free layer is changed to be parallel or anti-parallel to the magnetization of a pinned layer, by using a spin transfer torque (STT) or a spin orbit torque (SOT) caused within a magnetic tunnel junction, not an external magnetic field applied from around a magnetic tunnel junction (MTJ).

This is because there a problem that the external magnetic field-based magnetic RAM does not resolve that the size of the memory cell (including the magnetic tunnel junction) is inversely proportional to the magnitude of the external magnetic field, and thus half-selects the remaining memory cells other than one specific memory cell located at the intersection area of a row line and a column line during selecting the memory cell through orthogonalization of the row line and the column line.

On the other hand, the spin transfer torque-based magnetic RAM causes an electric current to directly flow into the magnetic tunnel junction (MTJ) through the row line and the column line at the time of a write operation and a read operation using an external power source to induce magnetization inversion of the free layer, thereby reducing the size of the memory cell. Also, the spin transfer torque-based magnetic RAM is structurally simple without an additional line for applying an external magnetic field compared with an external magnetic field based magnetic RAM.

Further, the spin orbit torque-based magnetic RAM causes a spin current to flow into a magnetic tunnel junction through a low line during a write operation, and a charge (or conduction) current to flow into a magnetic tunnel junction through a column line during a read operation, by using an external power source, so that the performance of the tunnel barrier layer is not decreased compared with the spin transfer torque-based magnetic RAM, whereby the spin orbit torque-based magnetic RAM can be used for a longer time than the spin transfer torque-based magnetic RAM, and thus more advantageous in terms of data processing speed and power.

Thus, the spin orbit torque-based magnetic RAM has been manufactured as a result of recent research of magnetic dynamics or spin dynamics compared with the external magnetic field-based or spin orbit torque-based magnetic RAMS. On the other hand, for the above-mentioned spin orbit torque-based magnetic RAM, Korean Patent No. 10-0232667 discloses "Exchange coupling film and magneto resistive effect element" which can be adopted as a related art. In the above related art, the magneto resistive effect element has a cobalt (Co) or cobalt alloy in a ferromagnetic layer.

Since the ferromagnetic material layer has a high perpendicular magnetic anisotropy when the ferromagnetic material layer replaces the free layer with a single film in a spin orbit torque-based magnetic RAM, the spin orbit torque-based magnetic RAM is operated in such a manner as to have high values of both a magnetic damping constant $\alpha$ and a spin Hall angle $\theta_{SH}$ in the free layer while having a high value of a spin transparency at an interface between the row line (consisted of heavy metal) and the ferromagnetic layer, whereby a driving current density $J_C$ is increased.

SUMMARY OF THE INVENTION

Accordingly, the present invention has been made keeping in mind the above problems occurring in the related art, and an object of the present invention is to provide a spin orbit torque magnetic RAM that is operated in such a manner as to maintain a tendency of increasing and decreasing of a magnetic damping constant $\alpha$ and a tendency of increasing and decreasing of a spin Hall angle $\theta_{SH}$ in a free layer in opposite to each other thereby reducing a driving current density $J_C$, in a row select line, a free layer, a tunnel barrier, a pinned layer, and a column select line that are sequentially stacked, even if the spin selectivity is high at an interface between the row select line and the free layer.

In order to obtain the above objects, a spin orbit torque magnetic RAM according to the present invention includes at least one row selection line positioned on a silicon substrate to induce a spin orbit interaction therein; at least one first magnetic pattern positioned on the row selection line; a second magnetic pattern positioned on the first magnetic pattern; a tunnel barrier positioned on the second magnetic pattern; and a third magnetic pattern positioned on the tunnel barrier, wherein the first magnetic pattern is made of a cobalt film, the first magnetic pattern and the second magnetic pattern have a total thickness of 5 nm to form a free layer, and the third magnetic pattern is formed with a pinned layer in which a magnetization direction is fixed.

The row selection line may include at least one selected from a group consisting of platinum (Pt), tantalum (Ta), tungsten (W), hafnium (Hf), rhenium (Re), iridium (Ir), copper (Cu), gold (Au), silver (Ag), titanium (Ti), platinum-manganese (PtMn), iron-manganese (FeMn), iridium-manganese (IrMn), bismuth selenide ($Bi_2Se_3$), bismuth telluride ($Bi_2Te_3$), molybdenum sulfur ($MoS_2$), tungsten telluride ($WTe_2$), indium arsenide (InAs), gallium arsenide (GaAs), two dimensional transition metal dichalcogenides, III-V semiconductors, and superconductors.

A thickness of the first magnetic pattern may be decreased or increased by the same magnitude as a thickness of the second magnetic pattern is increased or decreased.

The second magnetic pattern may include permalloy (Py).

When the first magnetic pattern and the second magnetic pattern are increased or decreased, and decreased or increased by the same magnitude with respect to each other while maintaining the total thickness, a tendency of increasing and decreasing of the magnetic damping constant ($\alpha$) and a tendency of increasing and decreasing of the spin Hall angle ($\theta_{SH}$) may be opposite to each other.

The first magnetic pattern and the second magnetic pattern may have a value of 1.0E+08 to 2.0E+08 ($A/cm^2$) of a driving current density according to 0.5 nm to 4.5 nm of a thickness of the cobalt film in the first magnetic pattern when measuring a spin torque ferromagnetic resonance.

The first magnetic pattern and the second magnetic pattern may contain iron (Fe) and boron (B) on the cobalt film, or contain iron and gadolinium (Gd) on the cobalt film, or contain iron and terbium (Tb) on the cobalt film, or contain iron, gadolinium, terbium, dysprosium (Dy), and holmium (Ho) on the cobalt film.

The first magnetic pattern and the second magnetic pattern may maximize spin transparency at an interface between the row select line and the first magnetic pattern, and minimize two-magnon electron scattering at an interface between the second magnetic pattern and the tunnel barrier.

The row select line may generate spin current from a first current in-plane due to the spin orbit interaction and then transmit the spin current sequentially to the first magnetic pattern and the second magnetic pattern, while the first current flows through a row line power supply ($V_R$), and transmit an angular momentum of the spin current to a lower magnetization that is a total magnetic moment of the first magnetic pattern and the second magnetic pattern, so that the lower magnetization of the first magnetic pattern and the second magnetic pattern may be changed in direction to be parallel or anti-parallel to an upper magnetization of the third magnetic pattern, thereby performing a data write operation.

The spin orbit torque magnetic RAM may further includes a column select line crossing with the row select line and electrically connected to a column line power source ($V_C$) and the third magnetic pattern, wherein the column select line causes a second current to flow along the third magnetic pattern, the tunnel barrier, the second magnetic pattern, the first magnetic pattern, and the data write pattern through the column line power source ($V_C$), and performs a data read operation so as to measure a magnetic resistance signal at a data low level when the lower magnetization of the first magnetic pattern and the second magnetic pattern has a parallel direction with respect to the upper magnetization of the third magnetic pattern, or to measure a magnetic resistance signal at a data high level when the lower magnetization of the first magnetic pattern and the second magnetic pattern has an anti-parallel direction with respect to the upper magnetization of the third magnetic pattern.

According to the present invention, in the row select line, the free layer, the tunnel barrier, the pinned layer, and the column select line that are sequentially stacked, the free layer includes a first magnetic pattern and a second magnetic pattern in such a manner that the first magnetic pattern corresponds to a magnetic body having high spin transparency and the second magnetic pattern corresponds to a magnetic body having low increase amount in magnetic damping constant due to two-magnon electron scattering, whereby tendencies of increasing and decreasing the magnetic damping constant α and the spin Hall angle $\theta_{SH}$ can be maintained opposite to each other.

The present invention includes the row select line, the free layer, the tunnel barrier, the pinned layer, and the column select line that are sequentially stacked, in which at least two magnetic patterns are sequentially stacked in the free layer, whereby a tendency of increasing and decreasing of the magnetic damping constant α at an interface between the row select line and the free layer and a tendency of increasing and decreasing of the spin Hall angle $\theta_{SH}$ at an interface between the free layer and the tunnel barrier are maintained opposite to each other, thereby reducing the driving current density $J_C$.

BRIEF DESCRIPTION OF THE DRAWINGS

The above and other objects, features and other advantages of the present invention will be more clearly understood from the following.

DETAILED DESCRIPTION OF THE INVENTION

Figure 1:
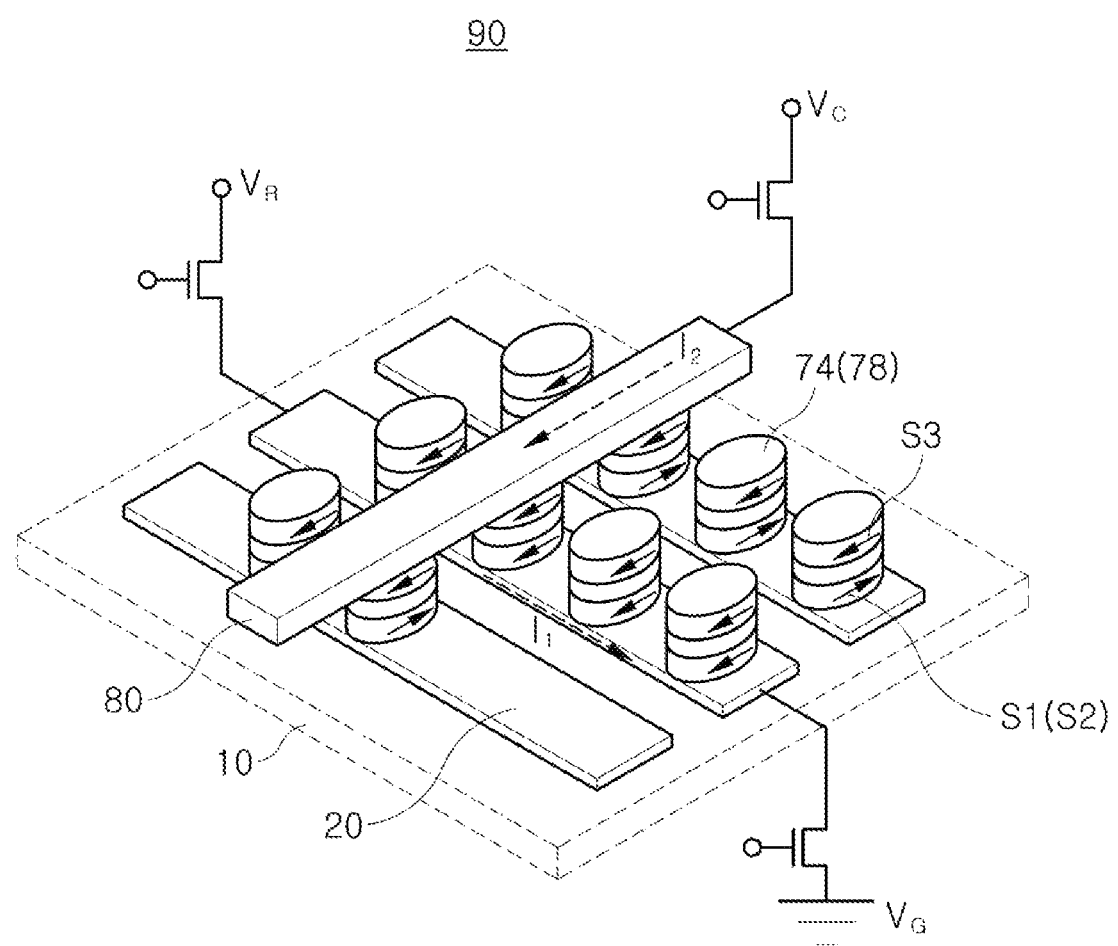
FIG. 1 is a schematic diagram of a spin orbit torque magnetic RAM according to the present invention.

The following detailed description of the invention refers to the accompanying drawings, which illustrate, by way of example, specific embodiments in which the invention may be practiced. These embodiments are described in sufficient detail to enable those skilled in the art to practice the invention. It should be understood that the various embodiments of the present invention are different, but need not be mutually exclusive. For example, certain features, structures, and characteristics described herein may be implemented in other embodiments without departing from the spirit and scope of the invention in connection with one embodiment. It is also to be understood that the position or arrangement of the individual components within each disclosed embodiment may be varied without departing from the spirit and scope of the invention. The following detailed description is, therefore, not to be taken in a limiting sense, and the scope of the present invention is to be limited only by the appended claims, along with the full scope of equivalents to which such claims are entitled, if properly explained. In the drawings, like reference numerals refer to the same or similar functions throughout the several views, and length and area, thickness, and the like, and their shapes may be exaggerated for convenience.

Hereinafter, preferred embodiments of the present invention will be described in detail with reference to the accompanying drawings, so that those skilled in the art can easily carry out the present invention.

FIG. 1 is a schematic diagram of a spin orbit torque magnetic RAM according to the present invention.

Figure 2:
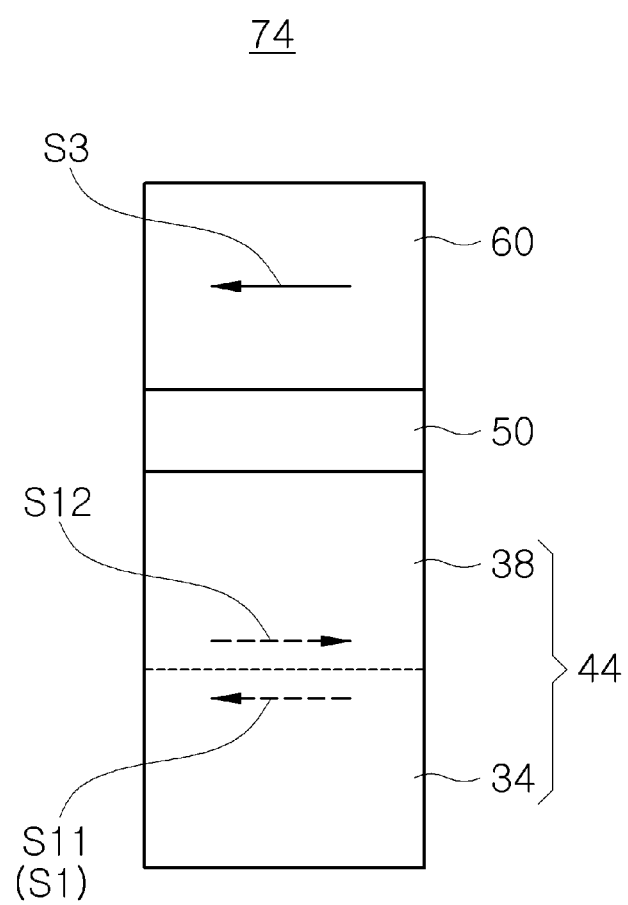
FIG. 2 is a schematic diagram showing a magnetic tunnel junction in a spin orbit torque magnetic RAM of FIG. 1.

FIG. 2 is a schematic diagram showing magnetic tunnel junction in a spin orbit torque magnetic RAM of FIG. 1

Referring to FIGS. 1 and 2, a spin orbit torque (SOT) magnetic RAM 90 according to the present invention includes a row selection line 20, a magnetic tunnel junction 74, and a column selection line 80, which are sequentially stacked on a silicon substrate 10. Herein, at least one row select line 20 is disposed on the silicon substrate 10 and at least one magnetic tunnel junction 74 is disposed on the row select line 20. The magnetic tunnel junction 74 includes a first magnetic pattern 34, a second magnetic pattern 38, a tunnel barrier 50, and a third magnetic pattern 60, which are sequentially stacked.

Herein, the row select line 20 includes one selected from a group consisting of platinum (Pt), tantalum (Ta), tungsten (W), hafnium (Hf), rhenium (Re), iridium (Ir), copper (Cu), gold (Au), silver (Ag), titanium (Ti), platinum-manganese (PtMn), iron-manganese (FeMn), iridium-manganese (IrMn), bismuth selenide ($Bi_2Se_3$), bismuth telluride ($Bi_2Te_3$), molybdenum sulfur ($MoS_2$), tungsten telluride ($WTe_2$), indium arsenide (InAs), gallium arsenide (GaAs), two dimensional transition metal dichalcogenides, III-V semiconductors, and superconductors.

The row select line 20 may be electrically connected to a row line power supply $V_R$ of the spin orbit torque magnetic RAM 90. The row select line 20 is operated such that a first current I1 in-plane flows through the row line power supply $V_R$ to induce a spin orbit interaction therein and to generate a spin current (not shown in the drawing) from the first current $I_1$ due to the spin orbit interaction.

At the magnetic tunnel junction 74, the first magnetic pattern 34 and the second magnetic pattern 38 constitute a free layer 44 having a total thickness of 5 nm. The first magnetic pattern 34 is made of a cobalt film (Co film). The second magnetic pattern 38 includes permalloy (Py) that is consisted of an alloy film of iron (Fe) and nickel (Ni). The thickness of the first magnetic pattern 34 is decreased or increased by the same magnitude as the thickness in the second magnetic pattern 38 is increased or decreased.

The free layer 44 receives the spin current from the row select line 20 through the first magnetic pattern 34. The spin current determines a direction of a lower magnetization (S1) that is a total magnetic moment of the free layer 44. The tunnel barrier 50 includes magnesium oxide (MgO) to enhance tunneling magneto resistance (TMR). The third magnetic pattern 60 is formed with a pinned layer in which the magnetization direction of the upper magnetization S3 is fixed.

The column selection line 80 is made of a metal material and electrically connected to the third magnetic pattern 60 while intersecting with the row select line 20, and also is electrically connected to the column line power supply $V_C$ of the spin orbit torque magnetic RAM 90. The column selection line 80 may cause a second current $I_2$ to flow into the magnetic tunnel junction 74 and the row select line 20 when driving through the column line power supply $V_C$.

Figure 3:
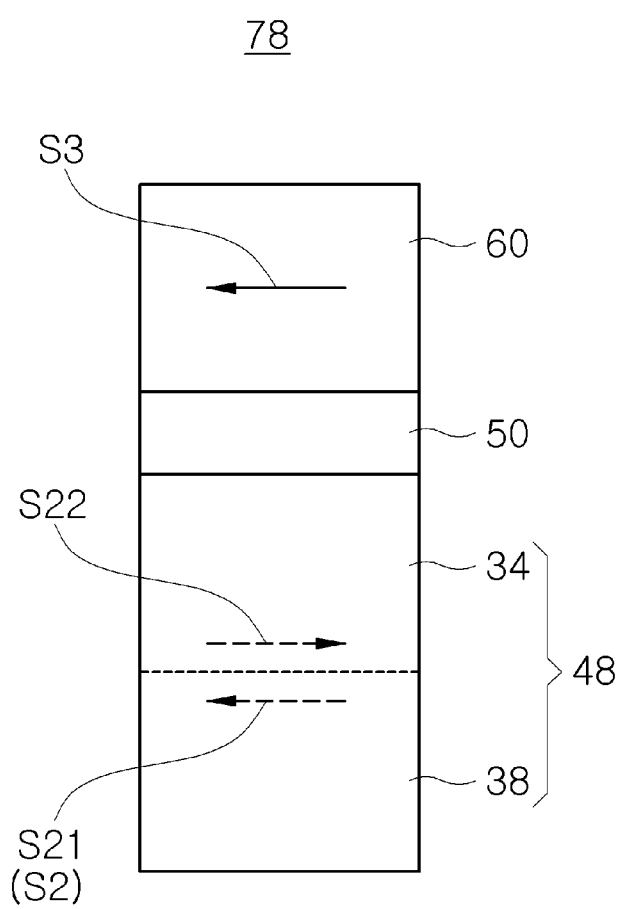
FIG. 3 is a schematic view showing a comparative example compared with a magnetic tunnel junction of FIG. 2.

FIG. 3 is a schematic view showing a comparative example compared with a magnetic tunnel junction of FIG. 2.

Referring to FIG. 3, a magnetic tunnel junction (TMR) according to the comparative example has a structure similar to the magnetic tunnel junction 74 of FIG. 2, but the free layer 48 of the magnetic tunnel junction 78 consists of a second magnetic pattern 38 and a first magnetic pattern 34 that are sequentially stacked in a different manner from the free layer 44 of the magnetic tunnel junction 74. The magnetic tunnel junction 74 has a lower magnetization S1 and an upper magnetization S3 in the free layer 44 and the pinned layer 60, respectively, as shown in FIG. 2.

The lower magnetization S1 is reversed in magnetization to be changed to magnetization S11 parallel to or magnetization S12 anti-parallel to the upper magnetization S3 by spin current directed from the row select line 20 to the free layer 44 in FIG. 1. Similarly, the magnetic tunnel junction 78 may have a lower magnetization S2 and an upper magnetization S3 at the free layer 44 and the pinned layer 60, respectively. Here, the lower magnetization S2 is reversed in magnetization to be changed to magnetization S21 parallel or magnetization S22 anti-parallel to the upper magnetization S3 by the spin current directed from the row select line 20 to the free layer 48 in FIG. 1.

Thereafter, the free layer 48 is used to be compared with the free layer 44 with respect to physical properties in FIGS. 4 to 11 to ascertain electrical properties of the magnetic tunnel junctions 74 and 78. The free layers 44 and 48 have the same material in the first magnetic pattern 34 and the second magnetic pattern 38. The physical properties of the free layer 44 are applied to the spin orbit torque magnetic RAM 90 of FIG. 1.

Figure 4:
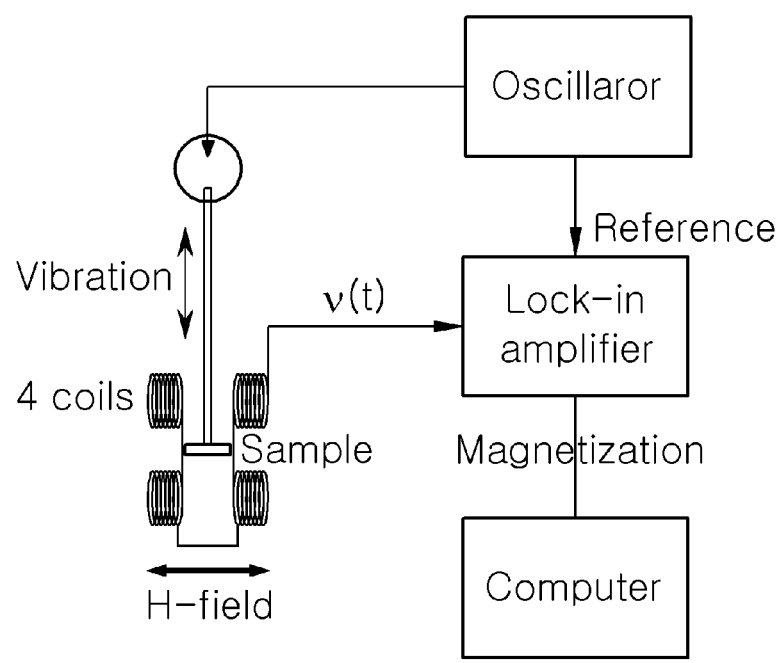
FIG. 4 is a schematic view showing the position of a first sample in a vibrating sample magnetometer (VSM) according to the present invention or the comparative example.
Figure 5:
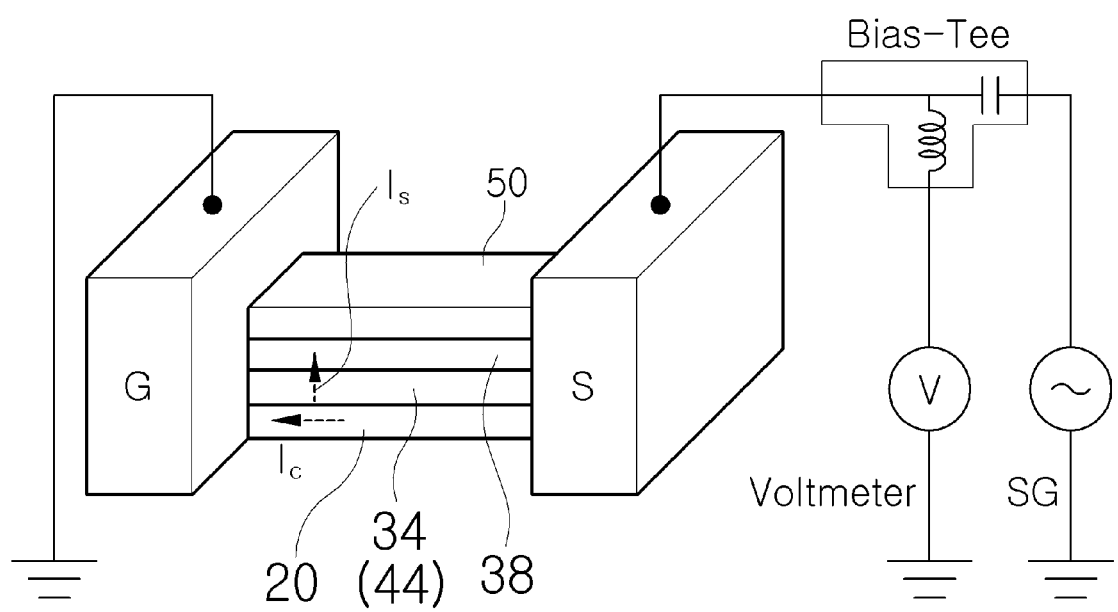
FIG. 5 is a schematic view showing the position of a second sample according to the present invention or the comparative example in a spin torque ferromagnetic resonance (ST-FMR) apparatus.

FIG. 4 is a schematic view showing the position of a first sample in a vibrating sample magnetometer (VSM) according to the present invention or the comparative example; and FIG. 5 is a schematic view showing the position of a second sample according to the present invention or the comparative example in a spin torque ferromagnetic resonance (ST-FMR) apparatus.

Herein, the vibration magnetometer shown in FIG. 4 and the spin torque magnetic resonance shown in FIG. 5 are used to extract parameters required to calculate the driving current density $J_O$ from the first and second samples, in order to facilitate calculating a driving current density ($J_O$) of equation 1 in which the formula of J. C. Slonczewski is modified to fit the spin orbit torque structure in an in-plane magnetized magnetic body.

$$J_0 = \alpha \frac{2e}{\hbar} \frac{M_s t_{FM}}{\theta_{SH}} \left( H_{k,\parallel} + \frac{4\pi M_s - H_{k,\perp}}{2} \right) \quad [\text{Equation 1}]$$

(Where, $\alpha$; magnetic damping constant, $M_S$; saturation magnetization intensity, $t_{FM}$; a thickness of magnetic body, $\theta_{SH}$; spin Hall angle, $H_{k,\parallel}$; planar anisotropy magnetic field intensity, and $H_{k,\perp}$; normal anisotropy magnetic field strength)

In addition, the first sample of FIG. 4 or the second sample of FIG. 5 is composed of a structure of a silicon (Si) substrate, tantalum (Ta, 1 nm), platinum (Pt, 5 nm), and a free layer (44 in FIG. 2; a structure of Co(t), Py(5−t)), MgO(2 nm), and Ta(2 nm)) that are sequentially stacked in the present invention (t is a thickness (nm)), and composed of a structure of a silicon (Si) substrate, tantalum (Ta, 1 nm), Platinum (Pt, 5 nm), and a free layer (48 in FIG. 3; a structure of Py(5−t), Co(t)), MgO(2 nm), and Ta(2 nm)) that are sequentially stacked in the comparative example.

However, in order to simplify the description of the present invention, in FIG. 4, a first sample of the present invention and a comparative example is referred to as only Co(t) and Py(5−t) as the free layer 44 and only Py(5−t) and Co(t) as the free layer 48, and in FIG. 5, the second sample of the present invention and the comparative example is referred to as only the free layer 44 and the free layer 48 sandwiched by Pt(5 nm) and MgO(5 nm), differently from the free layer 44 or the free layer 48 on Pt(5 nm).

The above-mentioned Ta(1 nm)/Pt(5 nm)/Co(t)/Py(5−t)/MgO(2 nm)/Ta(2 nm) and Ta(1 nm)/Pt(5 nm)/Py(5−t)/Co(t)/MgO(2 nm)/Ta(2 nm) may be stacked on the silicon substrate by a DC/RF sputtering equipment.

Referring to FIG. 4, the free layer (44 in FIG. 2) of the present invention or the free layer (48 in FIG. 3) according to the comparative example may be placed as a first sample between the coils in a vibrating sample magnetometer (VSM) as the first sample. Here, the first sample is composed of cobalt (Co) and permalloy (Py) that are sequentially stacked in the present invention, and the number of the first samples is five by applying thicknesses of 1 nm, 2 nm, 3 nm, 4 nm, and 5 nm in order to the stacked structure of cobalt (Co(t)) and permalloy (Py(5−t)) while maintaining a total thickness t of permalloy (Py) and cobalt (Co) as 5 nm.

In contrast, the first sample is made of permalloy (Py) and cobalt (Co) that are sequentially stacked in the comparative example, and the number of the first samples is five by applying thicknesses of 1 nm, 2 nm, 3 nm, 4 nm, and 5 nm in order to the stacked structure of permalloy (Py(5−t)) and cobalt (Co(t)) while maintaining a total thickness t of permalloy (Py) and cobalt (Co) as 5 nm. The vibrating sample magnetometer VSM may measure a saturation magnetization intensity $M_S$ and an effective vertical saturation magnetic field intensity $H_k^{\textit{eff}}$ of the first sample. Here, the effective vertical saturation magnetic field intensity $H_k^{\textit{eff}}$ may be expressed by Equation 2.

$$H_k^{\textit{eff}} = 4\pi M_S - H_{k,\perp}$$ [Equation 2]

More specifically, the vibrating sample magnetometer (VSM) is provided such that a sinusoidal electrical signal is induced in coils according to sinusoidal-vibration of the first sample by performing sinusoidal-vibration for the first sample under a constant external magnetic field through an oscillator; the sinusoidal electric signal is received from the coils through a lock-in amplifier thereby amplifying the sinusoidal electric signal; and a sinusoidal electric signal amplified through a computer is compared with a signal output from a value of the magnetization M of a reference magnet to be converted into a value proportional to the magnetic moment of the first sample.

Referring to FIG. 5, the free layer and the tunnel barrier (44, 50 in FIG. 2) according to the present invention or the free layer and tunnel barrier (48, 50 in FIG. 3) according to the comparative example may be positioned as a second sample between the signal node S and the ground node G in the spin torque ferromagnetic resonance (ST-FMR) apparatus.

The second sample is composed of platinum (Pt) 20, cobalt (Co) 34, permalloy (Py) 38, and a tunnel barrier (MgO) 50 that are sequentially stacked in the present invention, and the number of the second samples is five by applying thicknesses of 1 nm, 2 nm, 3 nm, 4 nm, and 5 nm in order to the stacked structure of cobalt (Co(t)) and permalloy (Py(5−t)) while maintaining a total thickness t of cobalt (Co) and permalloy (Py) as 5 nm.

In contrast, the second sample is composed of platinum (Pt), permalloy (Py), cobalt (Co), and tunnel barrier (MgO) that are sequentially stacked in the comparative example, and the number of the second samples is five by applying thicknesses of 1 nm, 2 nm, 3 nm, 4 nm, and 5 nm in order to the stacked structure of permalloy (Py(5−t)) and cobalt (Co(t)) while maintaining a total thickness t of permalloy (Py) and cobalt (Co) as 5 nm.

In the spin torque ferromagnetic resonance apparatus, the spin torque ferromagnetic resonance is obtained by applying an external magnetic field to the second sample, and performing precessional motion of magnetization that is a total of magnetic moments from the free layer 44 or 48 by using a direction of an effective magnetic field (=internal magnetic field resistive to an external magnetic field inside an external magnetic field-free layer 44 or 48 applied to the free layer 44 or 48 from outside of the free layer (44 in FIG. 2 or 48 in FIG. 3) as an axis, and by absorbing energy of electromagnetic field onto the precessional motion of magnetization at the free layer 44 or 48 by applying electromagnetic field having the number of vibrations that matches the number of vibrations of precessional motion of magnetization.

To this end, the spin torque ferromagnetic resonance apparatus is provided such that a power of 10 dBm and a frequency of 4 to 15 GHz are input to a signal node S through a signal generator SG to apply a RF current to the second sample and a $V_{mix}$ signal is measured from the second sample through a DC voltmeter while RF current is applied to the second sample. Herein, the spin torque ferromagnetic resonance apparatus may extract the $V_{mix}$ signal according to a magnetic field or a frequency, and a resonance frequency $H_O$ and a half line width ($\Delta$) of the ferromagnetic resonance signal.

The $V_{mix}$ signal, the resonance frequency $H_O$, and the half line width are substituted into the Kittel formula (equation 3) and the Gilbert damping formula to obtain a effective shape anisotropy magnetic field intensity ($4\pi M_{\textit{eff}}$), a magnetic damping constant $\alpha$, and $\Delta_O$ from the Kittel formula and the Gilbert damping formula. The $\Delta_O$ is due to the inhomogeneity component of the second sample.

$$f = (\gamma/2\pi)[H_0(H_0 + 4\pi M_{\textit{eff}})]^{1/2}$$ [Equation 3]

(Where, f; frequency, $\gamma$; gyromagnetic ratio, and $4\pi M_{\textit{eff}}$; effective shape anisotropy magnetic field intensity)

Meanwhile, the Gilbert damping formula is well known to a person skilled in the art relating to magnetic RAM, and will not be described here.

Figure 6:
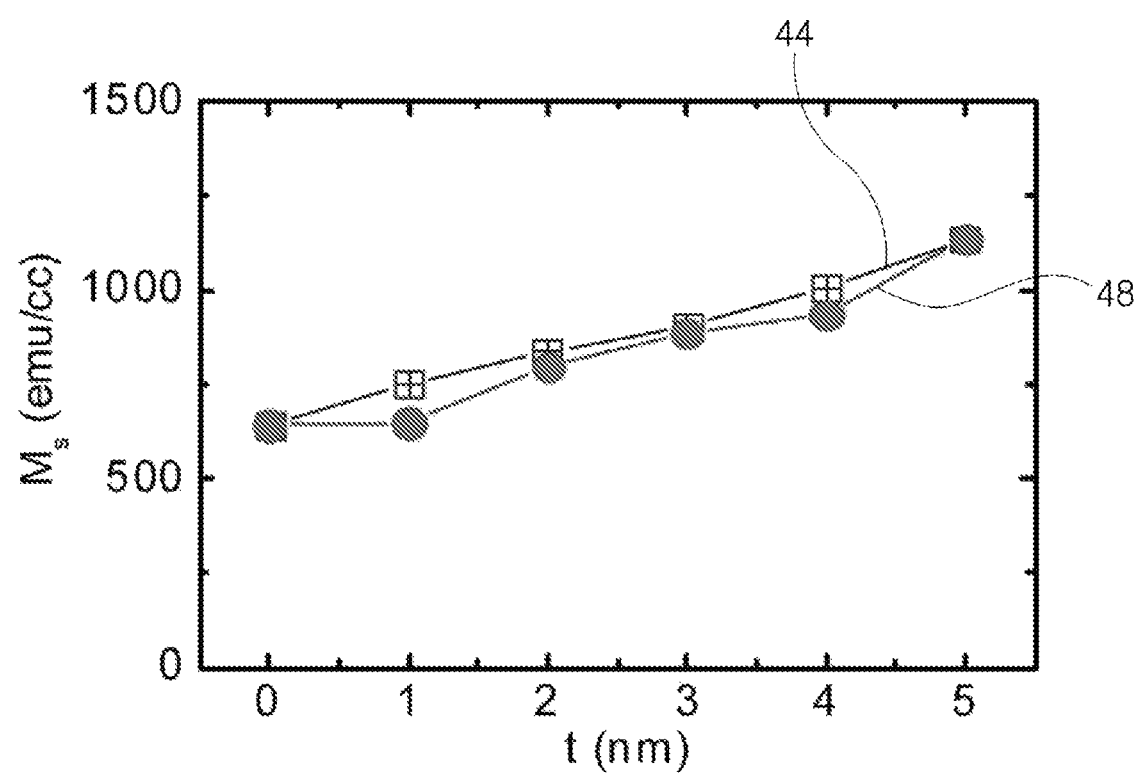
FIG. 6 is a graph showing a measurement result of a vibrating sample magnetometer for a first sample of FIG. 4.

FIG. 6 is a graph showing a measurement result of a vibrating sample magnetometer for a first sample of FIG. 4

Referring to FIG. 6, in the measurement result of the vibrating sample magnetometer (VSM), the saturation magnetization intensity $M_S$ of the free layer 44 according to the present invention is a little greater than the saturation magnetization intensity $M_S$ of the free layer 48 according to the comparative example for each thickness t of cobalt (Co), but the saturation magnetization intensity $M_S$ of the free layers 44 and 48 according to the present invention and the comparative example is linearly increased as thickness of the cobalt (Co) is increased.

This is because the cobalt (Co) has a higher saturation magnetization intensity $M_S$ than the permalloy (Py). In addition, the effective vertical saturation magnetic field intensity $H_k^{\textit{eff}}$ is linearly increased in a shape similar to the effective shape anisotropy magnetic field intensity ($4\pi M_{\textit{eff}}$) according to the thickness t of the cobalt (Co) in FIG. 7.

$$4\pi M_{\textit{eff}} = 4\pi M_S - H_{k,\perp}$$ [Equation 4]

Here, the effective vertical saturation magnetic field intensity $H_k^{\textit{eff}}$ is expressed by the equation equal to the effective shape anisotropy magnetic field intensity ($4\pi M_{\textit{eff}}$) of equation 4 (see Equations 2 and 4), and the effective vertical saturation magnetic field intensity $H_k^{\textit{eff}}$ and the effective shape anisotropy magnetic field intensity ($4\pi M_{\textit{eff}}$) are measured by measuring equipment different from each other, whereby they may have a slight difference in terms of size due to a difference between equipments, but they show a similar tendency.

Figure 7:
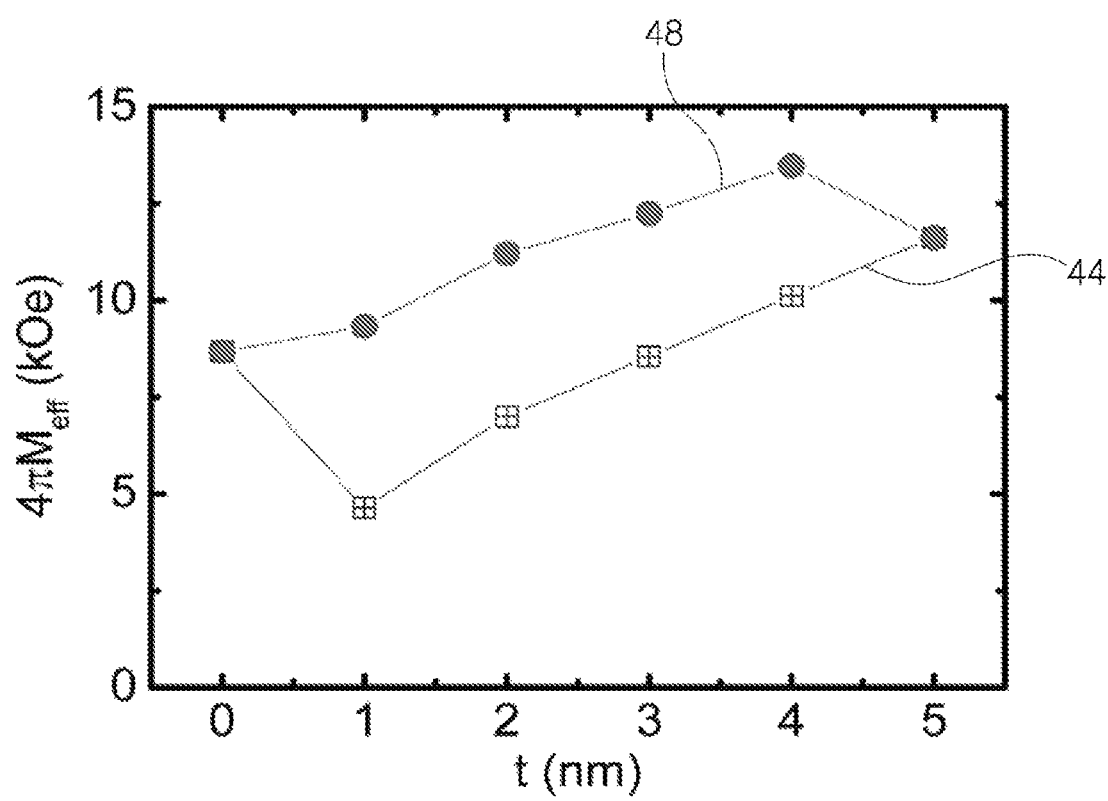
FIGS. 7 to 11 are graphs showing measurement results of a spin torque ferromagnetic resonance apparatus for a second sample of FIG. 5.

Meanwhile, considering increase and decrease in the effective vertical saturation magnetic field intensity $H_k^{\textit{eff}}$ according to a thickness t of cobalt (Co) via FIG. 7, the effective vertical saturation magnetic field intensity $H_k^{\textit{eff}}$ of the free layer 44 according to the present invention is smaller than the effective vertical saturation magnetic field intensity $H_k^{\textit{eff}}$ of the free layer 48 according to the comparative example for each thickness t of cobalt (Co), but the effective perpendicular saturation magnetic field intensity $H_k^{\textit{eff}}$ of the free layers 44 and 48 according to the present invention and the comparative example The magnetic field intensity $H_k^{eff}$ may be all increased linearly as a thickness t of cobalt (Co) is increased.

The reason why the free layer 44 is smaller than the free layer 48 in the effective vertical saturation magnetic field intensity $H_k^{eff}$ is because cobalt (Co) has perpendicular anisotropy magnetic field intensity $H_{k,\perp}$ larger than permalloy (Py). More specifically, considering the stacked structure of Ta(1 nm)/Pt(5 nm)/Co(t)/Py(5–t)/MgO(2 nm)/Ta(2 nm) and Ta(1 nm)/Pt(5 nm)/Py(5–t)/Co(t)/MgO(2 nm)/Ta(2 nm), a direct contact combination of the platinum (Pt) and cobalt (Co) has 3d-5d hybridization (or hybrid orbital theory; interactions of orbital 3d-5d electrons) better than a direct contact combination of platinum (Pt) and permalloy (Py).

Therefore, the cobalt (Co) has strong perpendicular magnetic anisotropy (property of aligning the spindle perpendicular to the surface of the platinum) compared with permalloy (Py) on the platinum (Pt) and has a perpendicular anisotropy magnetic field intensity $H_{k,\perp}$ greater than permalloy (Py) on the platinum (Pt).

FIGS. 7 to 11 are graphs showing measurement results of the spin torque magnetic resonance imaging apparatus for the second sample of FIG. 5.

Referring to FIG. 7, in the measurement result of the spin torque magnetic resonance imaging apparatus, considering increase and decrease in the effective shape anisotropy magnetic field strength ($4\pi M_{eff}$) according to the thickness t of cobalt (Co), the effective shape anisotropy magnetic field strength ($4\pi M_{eff}$) of platinum (Pt) and the free layer 48 according to the present invention is lower than the effective shape anisotropy magnetic field strength ($4\pi M_{eff}$) of platinum (Pt) and the free layer 48 according to the comparative example, but the effective shape anisotropy magnetic field strength ($4\pi M_{eff}$) of the free layers 44 and 48 according to the present invention and the comparative example may be increased linearly as the thickness t of cobalt (Co) is increased.

The reason why the stacked structure of platinum (Pt) and the free layer 44 is smaller than the stacked structure of platinum (Pt) and the free layer 48 in the effective shape anisotropy magnetic field strength $4\pi M_{eff}$ is satisfied with what the effective perpendicular saturation magnetic field intensity $H_k^{eff}$ was described referring to FIG. 6. This is because the effective shape anisotropy magnetic field intensity $4\pi M_{eff}$ and the effective vertical saturation magnetic field intensity $H_k^{eff}$ are described by the same formula (see equations 2 and 4).

Figure 8:
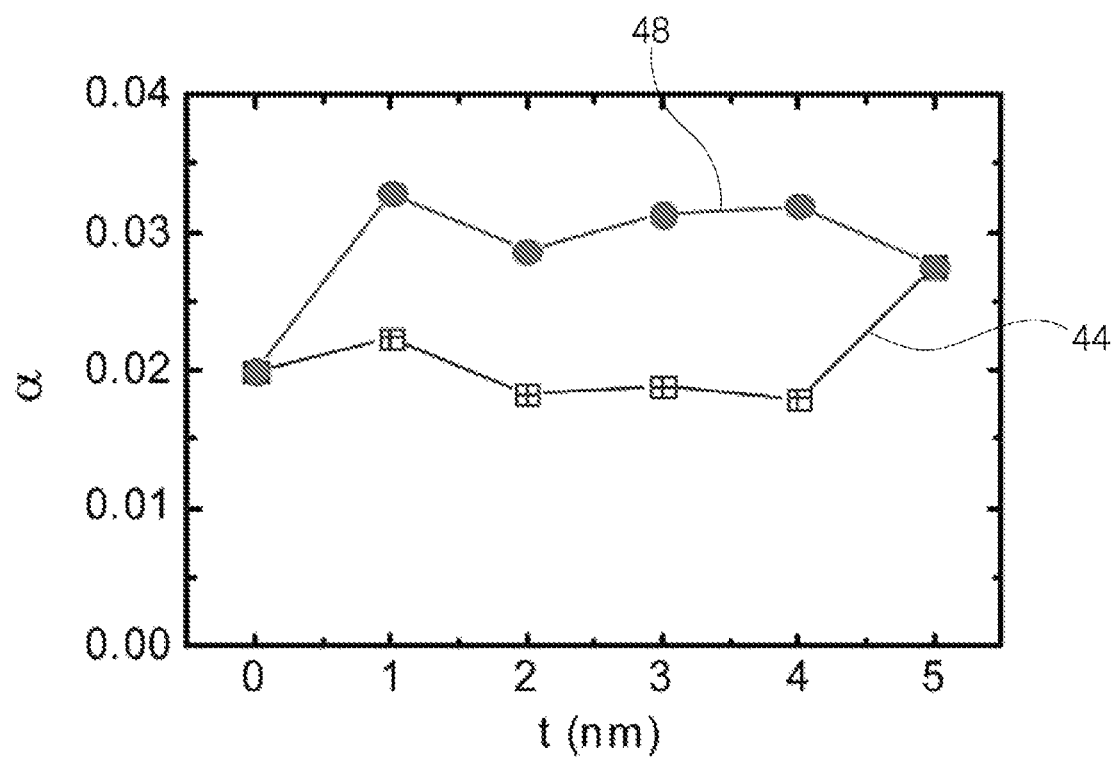

Referring to FIG. 8, in the measurement result of the spin torque magnetic resonance imaging apparatus, considering the increase/decrease in the magnetic damping constant $\alpha$ according to the thickness t of cobalt (Co), the magnetic damping constant $\alpha$ of platinum (Pt) and the free layer 44 according to the present invention is lower than the magnetic damping constant $\alpha$ of platinum (Pt) and the free layer 48 according to the comparative example for each thickness t of the cobalt (Co), but the magnetic damping constant $\alpha$ Of the free layers 44 and 48 according to the present invention and the comparative example is kept substantially horizontal as the thickness t of cobalt (Co) is increased.

The magnetic damping constant $\alpha$ is a value that explains a phenomenon that the spin that was physically in a ground state is excited to a high energy state by the external factor and then returns to the ground state while losing energy from the high energy state. The reason why the stacked structure of platinum (Pt), the free layer 44, and the tunnel barrier 50 is smaller than the stacked structure of platinum (Pt), the free layer 48, and the tunnel barrier 50 in the magnetic damping constant $\alpha$ is that permalloy (Py) has two-magnon electron scattering lower than cobalt (Co), considering an stacking order of cobalt (Co) and permalloy (Py) on platinum (Pt) and a kind of magnetic material spaced from platinum (Pt).

The tow-magnon electron scattering is caused by the roughness of a thin film and causes a damping phenomenon by excitation of magnon having a finite momentum vector with overlapping of magnon having a finite momentum vector and magnon having a momentum of '0'. Herein, the two-magnon electron scattering occurs at an interface of the free layer 48 and the tunnel barrier 50 and in an interface of the free layer 48 and the tunnel barrier 50 in the stacked structure of platinum (Pt), the free layer 44, and the tunnel barrier and the stacked structure of platinum (Pt), the free layer 48, and the tunnel barrier 50.

Figure 9:
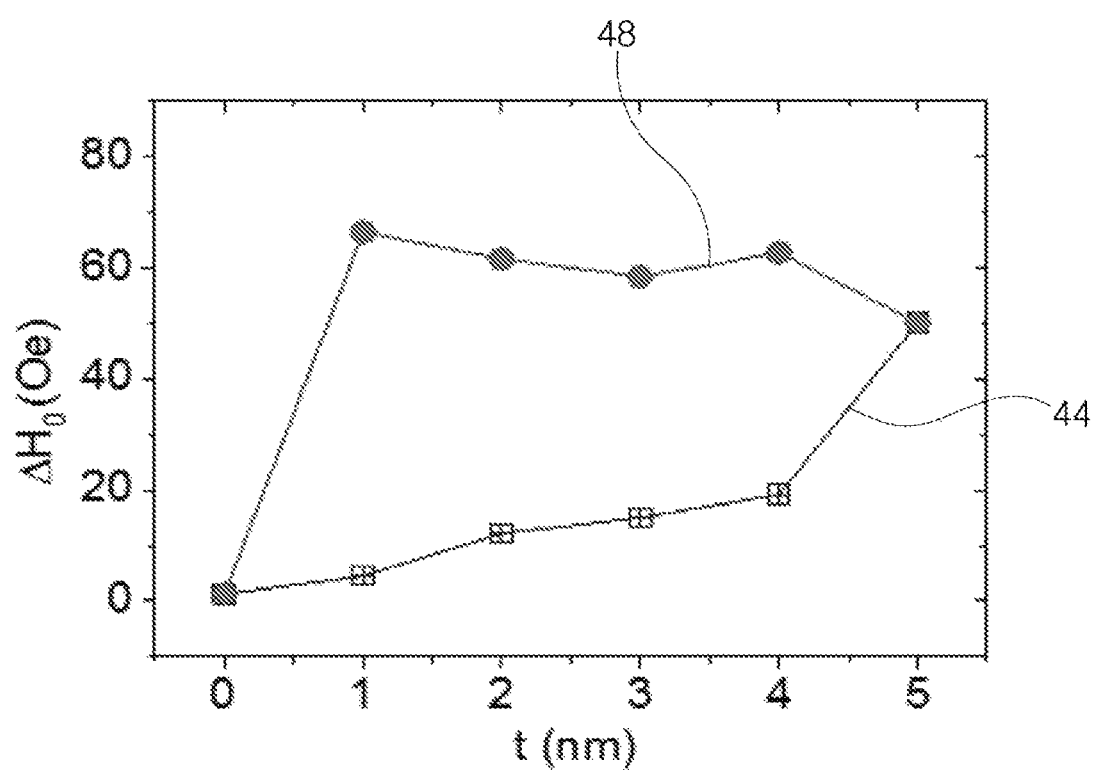

Referring to FIG. 9, in the measurement result of the spin torque magnetic resonance imaging apparatus, considering the increase/decrease in a resonance frequency $\Delta H_O$ according to the thickness t of cobalt (Co), the resonance frequency $\Delta H_O$ of platinum (Pt) and the free layer according to the present invention is lower than the resonance frequency $\Delta H_O$ of platinum (Pt) and the free layer 48 according to the comparative example for each thickness t of the cobalt (Co), but the resonance frequency $\Delta H_O$ Of the free layers 44 and 48 according to the present invention and the comparative example is linearly increased as the thickness t of cobalt (Co) is increased.

During the generation of the spin torque ferromagnetic resonance in the spin torque ferromagnetic resonator, the free layers 44 or 48 according to the present invention and the comparative example cause a spin pumping effect, so that angular momentum of the magnetization S1 and S2 is transferred to conduction electrons during precessional motion of the magnetization S1 or S2 in the free layer 44 or 48, thereby changing a phase of the ferromagnetic resonance signal and changing the half line width A and the resonance frequency $\Delta H_O$ of the ferromagnetic resonance signal simultaneously.

That is, a change in the half line width D causes a change in the resonance frequency $\Delta H_O$ in the ferromagnetic resonance signal. Herein, the reason why the stacked structure of platinum (Pt) and the free layer 44 is smaller than the stacked structure of platinum (Pt) and the free layer 48 in the resonance frequency $\Delta H_O$ is that the phase of the ferromagnetic resonance signal according to the angular momentum is changed smaller in the magnetization S1 of the free layer 44 than the magnetization S2 of the free layer 48, during the generation of the spin torque ferromagnetic resonance.

Figure 10:
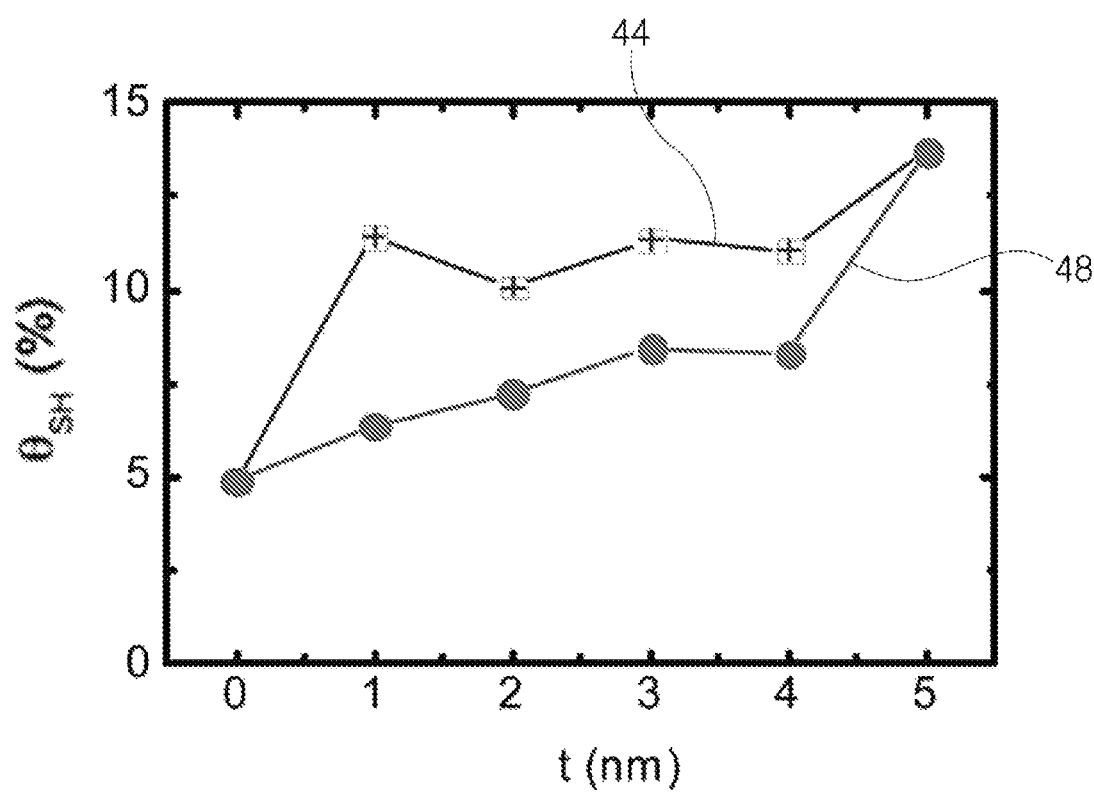

Referring to FIG. 10, in the measurement result of the spin torque magnetic resonance imaging apparatus, considering the increase/decrease in the spin Hall angle $\theta_{SH}$ according to the thickness t of cobalt (Co), the spin Hall angle $\theta_{SH}$ of platinum (Pt) and the free layer 44 according to the present invention is lower than the spin Hall angle $\theta_{SH}$ of platinum (Pt) and the free layer 48 according to the comparative example for each thickness t of the cobalt (Co), but the spin Hall angle $\theta_{SH}$ Of the free layers 44 and 48 according to the present invention and the comparative example is linearly increased as the thickness t of cobalt (Co) is increased.

During the generation of the spin torque ferromagnetic resonance in the spin torque ferromagnetic resonator, the free layers 44 or 48 according to the present invention and the comparative example cause a spin pumping effect, so that angular momentum of the magnetization S1 or S2 is transferred to conduction electrons during precessional motion of the magnetization S1 or S2 in the free layer 44 or 48, thereby causing a spin polarization of the conduction electrons to generate spin current and causing the spin current to flow from the free layer 44 or 48 towards platinum (Pt). Herein, the spin Hall angle $\theta_{SH}$ is described as equation 5 below.

$$\theta_{sh} = |J_S|/|J_C| \qquad \text{[Equation 5]}$$

(where, $J_S$; spin current density, and $J_C$; charge (or conductivity) current density)

In FIG. 5, at the time of measuring the spin torque ferromagnetic resonance, the spin torque ferromagnetic resonance apparatus causes charge (or conductive) current $I_C$ (=$J_C \times A1$ (where A1 is the area)) to flow from a signal node S towards a ground node G in the free layer 44 or 48 of the present invention or the comparative example while a RF current is applied to the signal node S through a signal generator SG; attenuates the angular momentum of the magnetization and polarizes the spin of the conduction electrons in the direction of the effective magnetic field by impulsing the magnetization (S1 or S2) and the conduction electrons during precessional motion of magnetization S1 or S2 in the free layer 44 or 48; and causes spin current $I_S$ (=$J_S \times A2$ (where, A2 is an area)) to flow in the platinum (Pt) 50 by injecting the electrons of the spin polarized from the free layer 44 or 48 toward the Pt layer 50.

Herein, the reason why the stacked structure of platinum (Pt) and the free layer 44 is larger than the stacked structure of platinum (Pt) and the free layer 48 in the spin Hall angle $\theta_{SH}$ is that spin torque ferromagnetic resonance $J_S$ according to the angular momentum in the magnetization S1 of the free layer 44 is larger than the magnetization S2 of the free layer 48 during the generation of the spin torque ferromagnetic resonance. That is, when the platinum (Pt) 50 and the free layer 44 or 48 form an ohmic contact, an interface between platinum (Pt) and cobalt (Co) has a spin transparency greater than an interface between platinum (Pt) and permalloy (Py). Therefore, the spin current $I_S$ has a higher transmittance at the interface between platinum (Pt) and cobalt (Co) than at the interface between platinum (Pt) and permalloy (Py).

Figure 11:
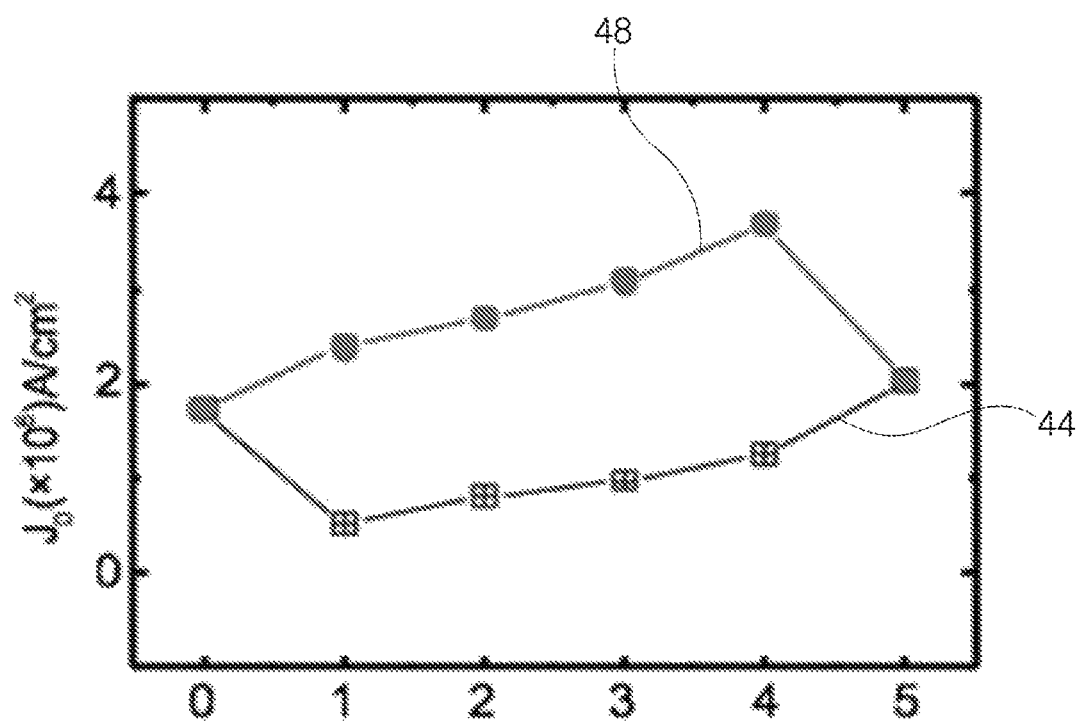

Referring to FIG. 11, considering the increase/decrease in the driving current density ($J_O$ in Equation 1) according to the thickness t of cobalt (Co) on the basis of the measurement results of the vibration sample magnetometer and the spin torque ferromagnetic resonance apparatus, the driving current density $J_C$ of platinum (Pt) and the free layer 44 according to the present invention is lower than the driving current density $J_O$ of platinum (Pt) and the free layer 48 according to the comparative example for each thickness t of cobalt (Co), and the driving current density $J_O$ of the free layers 44 and 48 according to the present invention and the comparative example is increased linearly as the thickness t of cobalt (Co) is increased.

More specifically, the vibration sample magnetometer and the spin torque ferromagnetic resonator have obtained measurement results as shown in the following table in the first sample and the second sample according to the present invention and the comparative example.

TABLE 1

| Division | First sample and second sample (present invention) | Comparison | First sample and second sample (comparative example) |
|---|---|---|---|
| Saturation magnetization intensity ($M_s$) | | ≈ | |
| Effective shape anisotropy magnetic field intensity ($4\pi M_{eff}$) | | < | |
| Magnetic damping constant ($\alpha$) | | < | |
| Spin Hall angle ($\theta_{SH}$) | | > | |
| Driving current density ($J_o$) | | < | |

(However, the first and second samples according to the present invention is composed of a structure of silicon (Si) substrate, tantalum (Ta, 1 nm), platinum (Pt, 5 nm), Co(t), Py(5−t), MgO(2 nm), and Ta(2 nm) and the first and second samples according to the comparative example is composed of a structure of silicon (Si) substrate, Ta(1 nm), Pt(5 nm), Py(5−t), Co(t), MgO(2 nm), and Ta(2 nm)).

In the driving current density of Equation 1, the planar anisotropy magnetic field intensity $H_{k,\parallel}$ is an important factor in terms of thermal stability between two spin information states, but generally has a relation of $H_{k,\parallel} < 4\pi M_{eff}/2$ so that the planar anisotropic magnetic field intensity $H_{k,\parallel}$ does not greatly affect the driving current density $J_O$, and thus is not taken into account in calculation of the driving current density $J_O$ in the parentheses of the equation 1.

Meanwhile, considering FIGS. 2, 3, 4, 8 and 10, when the free layer 44 according to the present invention has the first magnetic pattern 34 and the second magnetic pattern 38 sequentially stacked, so that a tendency of increasing and decreasing of the magnetic damping constant $\alpha$ and a tendency of increasing and decreasing of the spin Hall angle $\theta_{SH}$ are opposite to each other, when the first magnetic pattern 34 and the second magnetic pattern 38 increase or decrease, and decreases or increases by the same thickness with respect to each other while maintaining a total thickness (5 nm).

Since the first magnetic pattern 34 has a cobalt film as a single film, the first magnetic pattern 34 and the second magnetic pattern 38 may contain iron (Fe) and boron (B) on the cobalt film, or contains iron and gadolinium (Gd) on the cobalt film, or contains iron and terbium (Tb) on the cobalt film, or contains iron, gadolinium, terbium, dysprosium (Dy), and holmium (Ho) on the cobalt film. That is, the second magnetic pattern 38 is not alloyed with the cobalt forming the first magnetic pattern 34.

In addition, the first magnetic pattern 34 and the second magnetic pattern 38 maximize spin transparency at an interface between the row select line 20 and the first magnetic pattern 34, and minimizes two-magnon electron scattering at an interface between the second magnetic pattern 38 and the tunnel barrier 50.

The first magnetic pattern 34 and the second magnetic pattern 38 have a driving current density of 1.0E+08 to 2.0E+08 (A/cm$^2$) according to the thickness of 0.5 nm to 4.5 nm of cobalt (Co) in the first magnetic pattern 34 at the time of measuring the spin torque ferromagnetic resonance.

Hereinafter, an operation of the spin orbit torque magnetic RAM according to the present invention will be described with reference to FIGS. 1 and 2.

Referring to FIGS. 1 and 2, the spin orbit torque magnetic RAM 90 includes a row select line 20, a magnetic tunnel junction 74, and a column selection line 80, which are sequentially stacked on a silicon substrate 10. The magnetic tunnel junction 74 may be located at an intersecting area of the row select line 20 and the column select line 80 and thus electrically connected to the row select line 20 and the column select line 80.

Here, the magnetic tunnel junction 74 may include the first magnetic pattern 34, the second magnetic pattern 38, the tunnel barrier 50, and the third magnetic pattern 60, which are sequentially stacked. The spin orbit torque magnetic RAM 90 is operated such that while a first current I1 in-plane flows through the row line power supply $V_R$, the row select line 20 generates spin current from the first current due to spin orbit interaction and then transmits the spin current sequentially to the first magnetic pattern 34 and the second magnetic pattern 38.

In addition, the row select line 20 transmits an angular momentum of the spin current to the lower magnetization S1 that is a total magnetic moment of the first magnetic pattern 34 and the second magnetic pattern 38, so that the lower magnetization S1 of the first magnetic pattern 34 and the second magnetic pattern 38 is changed in direction to be parallel or anti-parallel to the upper magnetization S3 of the third magnetic pattern 60, thereby performing a data write operation.

After performing the data write operation of the row select line 20, the column select line 80 flows a second current $I_2$ along the third magnetic pattern 60, the tunnel barrier 50, the second magnetic pattern 38, the first magnetic pattern 34, and the row select line 20 through a column line power source $V_C$. When the lower magnetization S1 of the first magnetic pattern 34 and the second magnetic pattern 38 has a parallel direction with respect to the upper magnetization S3 of the third magnetic pattern 60, the column select line 80 may perform a data read operation so as to measure a magnetic resistance signal as a data low level.

Alternatively, when the lower magnetization S1 of the first magnetic pattern 34 and the second magnetic pattern 38 has an anti-parallel direction with respect to the upper magnetization S3 of the third magnetic pattern 60, the column selection line 80 may perform a data read operation so as to measure a magnetic resistance signal as a data high level.

The invention claimed is:

1. A spin orbit torque magnetic RAM, comprising:
at least one row selection line positioned on a silicon substrate to induce a spin orbit interaction therein;
at least one first magnetic pattern positioned on the row selection line;
a second magnetic pattern which is positioned on the first magnetic pattern and in contact with the first magnetic pattern;
a tunnel barrier positioned on the second magnetic pattern; and
a third magnetic pattern positioned on the tunnel barrier, wherein:
the first magnetic pattern is a film consisting essentially of cobalt,
the first magnetic pattern and the second magnetic pattern form a free layer,
the third magnetic pattern is formed with a pinned layer in which a magnetization direction is fixed,
the second magnetic pattern includes permalloy (Py), wherein the permalloy is an alloy film of iron (Fe) and nickel (Ni), and
the first magnetic pattern and the second magnetic pattern have a value of 1.0E+08 to 2.0E+08 (A/cm$^2$) of a driving current density according to 0.5 nm to 4.5 nm of a thickness of the cobalt film in the first magnetic pattern when measuring a spin torque ferromagnetic resonance.

2. The memory of claim 1, wherein the row selection line includes at least one selected from a group consisting of platinum (Pt), tantalum (Ta), tungsten (W), hafnium (Hf), rhenium (Re), iridium (Ir), copper (Cu), gold (Au), silver (Ag), titanium (Ti), platinum-manganese (PtMn), iron-manganese (FeMn), iridium-manganese (IrMn), bismuth selenide (Bi$_2$Se$_3$), bismuth telluride (Bi$_2$Te$_3$), molybdenum sulfur (MoS$_2$), tungsten telluride (WTe$_2$), indium arsenide (InAs), gallium arsenide (GaAs), two dimensional transition metal dichalcogenides, III-V semiconductors, and superconductors.

3. The memory of claim 1, wherein a thickness of the first magnetic pattern is decreased or increased by the same magnitude as a thickness of the second magnetic pattern is increased or decreased.

4. The memory of claim 1, wherein when the first magnetic pattern and the second magnetic pattern are increased or decreased, and decreased or increased by the same magnitude with respect to each other while maintaining the total thickness, a tendency of increasing and decreasing of the magnetic damping constant ($\alpha$) and a tendency of increasing and decreasing of the spin Hall angle ($\theta_{SH}$) are opposite to each other.

5. The memory of claim 1, wherein the first magnetic pattern contains iron (Fe) and boron (B) on the cobalt film.

6. The memory of claim 1, wherein the first magnetic pattern and the second magnetic pattern maximize spin transparency at an interface between the row select line and the first magnetic pattern, and minimize two-magnon electron scattering at an interface between the second magnetic pattern and the tunnel barrier.

7. The memory of claim 1, wherein the row select line generates spin current from a first current in-plane due to the spin orbit interaction and then transmits the spin current sequentially to the first magnetic pattern and the second magnetic pattern, while the first current flows through a row line power supply ($V_R$), and
transmits an angular momentum of the spin current to a lower magnetization that is a total magnetic moment of the first magnetic pattern and the second magnetic pattern, so that the lower magnetization of the first magnetic pattern and the second magnetic pattern is changed in direction to be parallel or anti-parallel to an upper magnetization of the third magnetic pattern, thereby performing a data write operation.

8. The memory of claim 7, further comprising a column select line crossing with the row select line and electrically connected to a column line power source ($V_C$) and the third magnetic pattern,
wherein the column select line causes a second current to flow along the third magnetic pattern, the tunnel barrier, the second magnetic pattern, the first magnetic pattern, and the data write pattern through the column line power source ($V_C$), and
performs a data read operation so as to measure a magnetic resistance signal as a data low level when the lower magnetization of the first magnetic pattern and the second magnetic pattern has a parallel direction with respect to the upper magnetization of the third magnetic pattern, or to measure a magnetic resistance signal as a data high level when the lower magnetization of the first magnetic pattern and the second magnetic pattern has an anti-parallel direction with respect to the upper magnetization of the third magnetic pattern.

9. A spin orbit torque magnetic RAM, comprising:
at least one row selection line positioned on a silicon substrate to induce a spin orbit interaction therein;
at least one first magnetic pattern positioned on the row selection line;
a second magnetic pattern positioned on the first magnetic pattern;
a tunnel barrier positioned on the second magnetic pattern; and
a third magnetic pattern positioned on the tunnel barrier, wherein the first magnetic pattern is made of a cobalt film, the first magnetic pattern and the second magnetic pattern have a total thickness of 5 nm to form a free layer, the third magnetic pattern is formed with a pinned layer in which a magnetization direction is fixed,
the second magnetic pattern includes permalloy (Py), and
the first magnetic pattern and the second magnetic pattern have a value of 1.0E+08 to 2.0E+08 (A/cm$^2$) of a driving current density according to 0.5 nm to 4.5 nm of a thickness of the cobalt film in the first magnetic pattern when measuring a spin torque ferromagnetic resonance.

10. The memory of claim 1, wherein the first magnetic pattern contains iron and gadolinium (Gd) on the cobalt film.

11. The memory of claim 1, wherein the first magnetic pattern contains iron and terbium (Tb) on the cobalt film.

12. The memory of claim 1, wherein the first magnetic pattern contains iron, gadolinium, terbium, dysprosium (Dy), and holmium (Ho) on the cobalt film.

* * * * *